(12) United States Patent
Sandhu et al.

(10) Patent No.: US 8,395,440 B2
(45) Date of Patent: Mar. 12, 2013

(54) APPARATUS AND METHOD FOR CONTROLLING POWER GATING IN AN INTEGRATED CIRCUIT

(75) Inventors: Bal S. Sandhu, Fremont, CA (US); Satchin Satish Idgunji, San Jose, CA (US); David Walter Flynn, Cambridge (GB)

(73) Assignee: ARM Limited, Cambridge (GB)

( * ) Notice: Subject to any disclaimer, the term of this patent is extended or adjusted under 35 U.S.C. 154(b) by 170 days.

(21) Appl. No.: 12/926,531

(22) Filed: Nov. 23, 2010

(65) Prior Publication Data

US 2012/0126879 A1    May 24, 2012

(51) Int. Cl.
*G05F 1/10* (2006.01)
(52) U.S. Cl. .................. 327/540; 327/541; 327/544
(58) Field of Classification Search .................. 327/540, 327/541, 544
See application file for complete search history.

(56) References Cited

U.S. PATENT DOCUMENTS

| 2006/0006929 A1 | 1/2006 | Caplan et al. |
| 2010/0117720 A1 | 5/2010 | Valentian et al. |

FOREIGN PATENT DOCUMENTS

EP   2 184 855   5/2010

OTHER PUBLICATIONS

Kawaguchi et al., "A Super Cut-Off CMOS (SCCMOS) Scheme for 0.5-V Supply Voltage with Picoampre Stand-By Current", 2000 *IEEE*, vol. 35, No. 10, Oct. 2000, pp. 1498-1501.
Valentian et al., "Gate Bias Circuit for an SCCMOS Power Switch achieving maximum leakage reduction", 2007 *IEEE*, (No date), pp. 300-303.
Clark et al., "Standby Power Management for a 0.18μm Microprocessor", *Islped '02*, Aug. 2002, pp. 7-12.
International Search Report and Written Opinion of the International Searching Authority mailed 12/20/11 in PCT/GB2011/051986.
A. Valentian et al, "Automatic Gate Biasing of an SCCMOS Power Switch Achieving Maximum Leakage Reduction and Lowering Leakage Current Variability" *IEEE Journal of Solid-State Circuits*, vol. 43, No. 7, Jul. 2008, pp. 1688-1698.

*Primary Examiner* — Kenneth B. Wells
(74) *Attorney, Agent, or Firm* — Nixon & Vanderhye P.C.

(57) ABSTRACT

An integrated circuit comprises a block of components to be power gated and power gating circuitry for selectively isolating the components from the source voltage supply to achieve such power gating. A voltage regulator provides a control voltage to the power gating circuitry when performing power gating operations. The control voltage may be set to any of a plurality of predetermined voltage levels. An adaptive controller receives operating parameter data from either or both of the block of components and the power gating circuitry, that operating parameter data being indicative of leakage current. The adaptive controller issues a feedback signal to the voltage regulator whose value depends on the received operating parameter data. The voltage regulator responds to the feedback signal to change the control voltage between the predetermined voltage levels until the operating parameter data indicates that a desired leakage current is obtained within the power gating circuitry.

14 Claims, 5 Drawing Sheets

APPARATUS AND METHOD FOR CONTROLLING POWER GATING IN AN INTEGRATED CIRCUIT

TECHNICAL FIELD

The technology relates to an apparatus and method for controlling power gating in an integrated circuit.

BACKGROUND

Within an integrated circuit, it is known to employ adaptive power management or dynamic voltage scaling (DVS) techniques in order to reduce the power dissipation on a chip. Adaptive power management is becoming ever more important as process geometries decrease. In particular, with leading edge nanometer technology, the individual components are becoming significantly smaller in size, and the decrease in size is giving rise to a significant increase in power consumption due to leakage current, leakage current being the current that is drawn by a component when it is in theory turned off.

As circuits become smaller and smaller due to technology scaling, the supply voltage to those circuits has to be reduced to reduce dynamic power consumption. However, a side effect of such scaling is that the threshold voltage and channel length of the transistors need to be lowered to prevent speed degradation, and this lowering of the threshold voltage makes the transistors more leaky, i.e. the leakage current increases as the threshold voltage decreases. For example, for each 100 mV reduction in threshold voltage, the sub-threshold leakage current (for a MOSFET transistor this being the leakage current between the source and drain of the transistor) can increase by a factor of ten to a hundred.

One common mechanism used in adaptive power management techniques in order to save energy is to shut down blocks of components on a chip when those blocks of components are not performing any useful function, for example when they are waiting for instructions from other parts of the system. Such blocks of components can be shut down using power gating techniques, where power gating circuitry is placed between a source voltage supply and the block of components, and when it is desired to shut the block of components down, the power gating circuitry isolates the block of components from the source voltage supply.

However, whilst such power gating techniques have traditionally given rise to significant energy savings, the ability for such power gating techniques to achieve significant energy savings is being compromised in integrated circuits based on leading edge nanometer technology, due to the reduced size of the components, and the associated increase in leakage current. For example, power gating circuitry is usually constructed using transistors such as PMOS transistors, and as a transistor's size decreases, its channel length is reduced, and this increases its channel leakage current. Accordingly, it is found that when the transistors in the power gating circuitry are turned off in order to isolate the block of components from the source voltage supply, those transistors are in fact not fully turned off, and significant leakage current through them can occur. This in turn results in the block of components itself not being fully powered down, and accordingly further leakage current being drawn by those components.

One known way to seek to address this problem is to force the power switch transistors of the power gating circuitry into a super cut-off region. For example, considering power gating circuitry formed of PMOS transistors, the voltage on the gate of the PMOS transistors can be driven to a voltage level above the source voltage supply level provided between the source and drain of the transistor. Such a mechanism can significantly reduce leakage current. However, blocks of components may be power gated for significant amounts of time, which means that such power gating transistors are exposed to a gate voltage that exceeds the source voltage supply for significant periods of time. This is undesirable, as such increased gate voltages serve to reduce the operational life (increase "wear out") of the transistors by slowly increasing their threshold voltage. Accordingly, whilst it is desirable to drive the power gating transistors into a super cut-off region in order to reduce leakage current, this has to be balanced against the desired life expectancy for the circuit which is reduced by the driving of such power gating transistors into the super cut-off region.

The article "Gate Bias Circuit for an SCCMOS Power Switch Achieving Maximum Leakage Reduction" by A Valentian et al, IEEE 2007 describes a technique for determining an optimal voltage to be applied to the gate of a power switch transistor in order to maximise leakage gain, dependent on operating conditions. The paper describes a circuit that uses two identical devices configured to measure the sub-threshold current and the gate leakage current. A charge pump is driven to vary the gate voltage dependent on a comparison between the sub-threshold current and the gate leakage current.

The article "A Super Cut-Off CMOS (SCCMOS) Scheme for 0.5V Supply Voltage with Picoampere Standby Current" by H Kawaguchi et al, IEEE Journal of Solid-State Circuits, Volume 35, No. 10, October 2000, Pages 1498 to 1501, describes a technique for using a four-stage charge pump to overdrive the gate of a low threshold voltage PMOS power gate switch transistor by a voltage that is 400 mV higher than the source voltage supply.

The article "Techniques for Aggressive Supply Voltage Scaling and Efficient Regulation" by A Dancy et al, IEEE 1997 Custom Integrated Circuits Conference, Pages 579 to 586, describes a leakage mitigation technique that uses a triple-well CMOS process to provide substrate voltage control. The logic circuits to be power gated are implemented using low threshold devices and are gated using series connected high threshold switches.

The article "Standby Power Management for a 0.18 μm Microprocessor" by L Clark et al, ISLPED '02 Aug. 12 to 14, 2002, Monterey, Calif., USA, Pages 7 to 12, describes a technique to mitigate leakage current using a back-bias scheme.

It would be desirable to provide an improved technique for controlling power gating in an integrated circuit, which enables the leakage current to be controlled whilst also seeking to reduce the impact on wear out of the integrated circuit.

SUMMARY

An integrated circuit comprises: a block of components; power gating circuitry configured to receive a source voltage supply, and to provide an internal voltage supply to said block of components, in a normal mode of operation the internal voltage supply being derived from the source voltage supply, and in a power saving mode of operation the power gating circuitry being configured to isolate the internal voltage supply from the source voltage supply; voltage regulator circuitry configured to provide a control voltage to said power gating circuitry during said power saving mode of operation, the control voltage being settable to any of a plurality of predetermined voltage levels; an adaptive controller configured to receive operating parameter data from at least one of the block of components and the power gating circuitry, the operating parameter data being indicative of leakage current within the power gating circuitry, and the adaptive controller being configured to issue a feedback control signal to the voltage regulator circuitry whose value is dependent on the received operating parameter data; the voltage regulator circuitry being responsive to the feedback control signal to change the control voltage between said plurality of predetermined voltage levels until the operating parameter data indicates a desired leakage current has been obtained within the power gating circuitry.

Voltage regulator circuitry is provided which can set a control voltage applied to the power gating circuitry to any of a plurality of predetermined voltage levels. Based on operating parameter data from either or both of the block of components being power gated and the power gating circuitry, an adaptive controller is configured to issue a feedback control signal to the voltage regulator circuitry. The voltage regulator circuitry changes the control voltage dependent on the feedback control signal until the operating parameter data indicates a desired leakage current has been obtained.

Such an approach provides an adaptive technique for determining the appropriate control voltage to provide to the power gating circuitry, with the aim of reducing the leakage current to an acceptable level, whilst avoiding undue wear out of the power gating circuitry by only providing a control voltage sufficient to achieve the desired leakage current. Through use of such a technique, the control voltage can readily be varied having regard to operating conditions. For example, the higher the operating temperature of the integrated circuit, the greater the leakage current will be. Hence, as the operating temperature increases, the control voltage will need to be varied to seek to bring the leakage current down to an acceptable level. Conversely, if the integrated circuit is running at a low temperature, the leakage current will be less, and may drop below a threshold level that would have been acceptable. In such cases, the control voltage can be changed in order to increase the leakage current, with the aim of reducing wear out of the components within the power gating circuitry.

The power gating circuitry can take a variety of forms. However, in one embodiment, the power gating circuitry comprises at least one PMOS transistor whose gate is driven by the control voltage during said power saving mode of operation, and the control voltage is set to exceed the source voltage supply by an overdrive voltage, the overdrive voltage being variable so as to enable any of said plurality of predetermined voltage levels to be set as said control voltage.

Hence, in one such embodiment, when the operating parameter data indicates that the leakage current is exceeding the desired leakage current, the adaptive controller is arranged to set the feedback control signal to a value that causes the voltage regulator circuitry to increase the overdrive voltage provided a maximum predetermined voltage level has not been reached. Similarly, when the operating parameter data indicates that the leakage current is below the desired leakage current, the adaptive controller is arranged to set the feedback control signal to a value that causes the voltage regulator circuitry to decrease the overdrive voltage provided a minimum predetermined voltage level has not been reached. By such an approach, it can be seen that the voltage regulator circuitry in combination with the adaptive controller serve to make the leakage current converge on a desired leakage current. Hence, excessive leakage current is prevented by increasing the overdrive voltage, and conversely the overdrive voltage can be reduced in order to reduce wear out of the power gating circuitry when the leakage current is low enough to allow, i.e. where the leakage current is below the desired leakage current. This enables a balance to be achieved between suppressing leakage current and maximising life of the circuitry.

In one embodiment, when the operating parameter data indicates that the leakage current matches the desired leakage current, the adaptive controller is arranged to set the feedback control signal to a value that causes the voltage regulator circuitry to maintain a currently set overdrive voltage. Hence, through adoption of the technique of such embodiments, the circuitry tends to converge on a steady state where a suitable control voltage is arrived at which produces a leakage current matching the desired leakage current.

Whilst the desired leakage current could be specified to be a specific current value, in one embodiment the desired leakage current is specified as a range of leakage current values, thereby enabling the above described convergence to more readily be achieved.

The adaptive controller can take a variety of forms. However, in one embodiment the adaptive controller comprises a state machine that is enabled when said low power mode is entered, the state machine transitioning between a plurality of states dependent on the received operating parameter data. The use of a state machine to provide the functionalities of the adaptive controller provides a particularly efficient mechanism for achieving the required functionality of the adaptive controller.

In one particular embodiment, following a feedback adjustment state where the value of the feedback control signal is changed, the state machine enters a waiting state where a predetermined event is awaited before the state machine transitions to a monitoring state to monitor the received operating parameter data. This allows a pause to be introduced between each adjustment of the control voltage, to allow the effects of the change in the control voltage to be realised before any further adjustments are made.

The predetermined event which is awaited when the state machine is in the waiting state can take a variety of forms, but in one embodiment the predetermined event is indicative that the control voltage most recently set by the voltage regulator circuitry has reached a steady state. By way of example, the predetermined event may be the elapse of a timer, or may take the form of receipt of a ready signal from the voltage regulator circuitry.

The number of predetermined voltage levels that can be specified for the control voltage can take a variety of forms. However, in one embodiment, the feedback control signal is an M bit value, enabling up to $2^m$ discrete predetermined voltage levels for the control voltage to be specified. Hence, with a relatively small size of feedback control signal, a relatively large number of discrete predetermined voltage levels may be specified.

In one embodiment, the adaptive controller has an interface via which an initial value of the feedback control signal may be specified. Hence, via such an interface, a microcontroller, or indeed software code, may program an initial value into the adaptive controller, so that on entry to the power saving mode of operation, a corresponding initial voltage level for the control voltage can be used.

The one or more pieces of operating parameter data received by the adaptive controller can be generated in a variety of ways. However, in one embodiment the integrated circuit further comprises one or more monitoring circuits for monitoring said at least one of the block of components and the power gating circuitry in order to produce said operating parameter data.

In one embodiment, such monitoring circuits may comprise a leakage sensor for detecting leakage current in said at least one of the block of components and the power gating circuitry whilst in said low power mode of operation. Alternatively, or in addition, the monitoring circuit may comprise a temperature sensor for monitoring the operating temperature of said at least one of the block of components and the power gating circuitry. As mentioned previously, an increase in temperature will give rise to an increase in leakage current, and hence information about the operating temperature can be used to determine a suitable adjustment to the control voltage.

Alternatively, or in addition, the monitoring circuits may comprise process skew monitoring circuitry for monitoring speed of operation of the block of components during the normal mode of operation. In particular, variations in the silicon on which the integrated circuits are produced will mean that some circuits inherently operate more quickly than other circuits. Process skew monitoring circuitry can determine whether a silicon is fast silicon (i.e. the integrated circuit is operating more quickly than the norm) or slow silicon (i.e. the integrated circuit is operating more slowly than the norm), and this information can be used to determine how to adjust the control voltage. In particular, components constructed on slow silicon have less leakage current than the same components constructed on fast silicon, and hence for an integrated circuit of the slow silicon type, a lower control voltage may be required to achieve the desired level of leakage current. By setting the control voltage to that lower level, the lifetime of the integrated circuit can be increased.

A method is provided of controlling power gating in an integrated circuit having a block of components, and power gating circuitry for receiving a source voltage supply and for providing an internal voltage supply to said block of components, in a normal mode of operation the internal voltage supply being derived from the source voltage supply, and in a power saving mode of operation the power gating circuitry being configured to isolate the internal voltage supply from the source voltage supply. The method comprises the steps of: employing a voltage regulator to provide a control voltage to said power gating circuitry during said power saving mode of operation, the control voltage being settable to any of a plurality of predetermined voltage levels; obtaining operating parameter data from at least one of the block of components and the power gating circuitry, the operating parameter data being indicative of leakage current within the power gating circuitry; issuing a feedback control signal to the voltage regulator whose value is dependent on the received operating parameter data; responsive to the feedback control signal, changing at the voltage regulator the control voltage between said plurality of predetermined voltage levels until the operating parameter data indicates a desired leakage current has been obtained within the power gating circuitry.

An integrated circuit comprises: a block of component means; power gating means for receiving a source voltage supply, and for providing an internal voltage supply to said block of component means, in a normal mode of operation the internal voltage supply being derived from the source voltage supply, and in a power saving mode of operation the power gating means for isolating the internal voltage supply from the source voltage supply; voltage regulator means for providing a control voltage to said power gating means during said power saving mode of operation, the control voltage being settable to any of a plurality of predetermined voltage levels; adaptive controller means for receiving operating parameter data from at least one of the block of component means and the power gating means, the operating parameter data being indicative of leakage current within the power gating means, and the adaptive controller means for issuing a feedback control signal to the voltage regulator means whose value is dependent on the received operating parameter data; the voltage regulator means, responsive to the feedback control signal, for changing the control voltage between said plurality of predetermined voltage levels until the operating parameter data indicates a desired leakage current has been obtained within the power gating means.

DESCRIPTION OF NON-LIMITING EXAMPLE EMBODIMENTS

Figure 1:
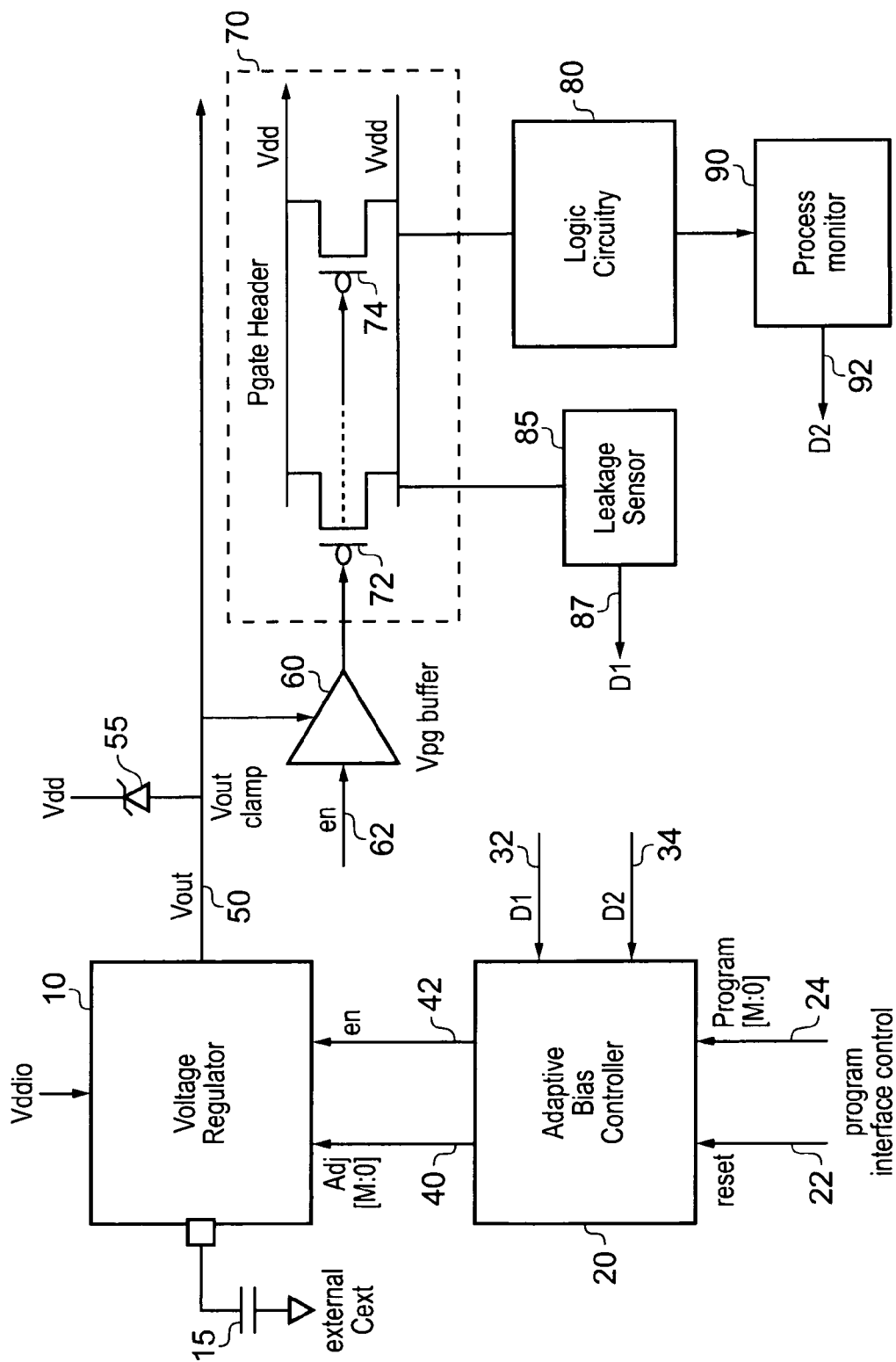
FIG. 1 is a block diagram of an integrated circuit in accordance with a first embodiment.

FIG. 1 is a block diagram of an integrated circuit in accordance with one embodiment. As shown in FIG. 1, an adaptive power controller 20 (referred to in FIG. 1 as an adaptive bias controller) is used to control the voltage regulator 10 to produce an output voltage which is used to drive the gates of transistors 72, 74 within a power gate header block 70 when the logic circuitry 80 is being placed in a power saving mode of operation. In particular, in the power saving mode of operation, the voltage regulator 10 produces an output voltage which is transferred by the buffer circuitry 60 to the gates of the transistor 72, 74 in order to turn those transistors off, thereby isolating the logic circuitry 80 from the voltage supply Vdd.

Various monitoring circuits 85, 90 are arranged to output operating parameter data to the adaptive bias controller 20, such operating parameter data being indicative of leakage current within the power gating circuitry 70. This operating parameter data hence provides a feedback mechanism which is used by the adaptive bias controller to vary the control signal sent to the voltage regulator, so as to alter the value of the voltage output over path 50 with the aim of modifying the leakage current until it reaches a desired leakage current. Whilst the desired leakage current can be expressed as a discrete value, it will typically be specified by a range of values.

Considering in more detail the block diagram of FIG. 1, it will be seen that the adaptive bias controller 20 has a program interface control input via which the adaptive bias controller can be reset over path 22, and can be programmed over path 24. The adaptive bias controller 20 is disabled during system power up by a power on reset signal input over path 22. During this time, the enable signal output by the adaptive bias controller will be disabled, in order to disable operation of the voltage regulator and to disable the buffer circuitry 60. When the buffer circuitry 60 is disabled, it will provide a logic zero level input to the gates of the various PMOS transistors 72, 74 within the power gating circuitry 70, causing those transistors to turn on, and couple the logic circuitry 80 to the supply voltage Vdd. In particular, in this case, it will be understood that the virtual supply voltage Vvdd is driven to the power supply voltage Vdd by the turning on of the transistors 72, 74.

However, following system power up, whenever it is desired to turn off power to the logic circuitry 80 in order to reduce power consumption of the integrated circuit, the adaptive bias controller 20 is arranged to issue a set enable signal over path 42 to the voltage regulator 10, and over path 62 to the buffer circuitry 60. When the enable signal is set, the voltage regulator 10 is arranged to generate the output voltage Vout over path 50, where the voltage Vout is equal to the supply voltage Vdd plus a variable overdrive voltage Vovr. The magnitude of the overdrive voltage is controlled by a binary value provided by the adaptive bias controller as a multi-bit bus signal over path 40.

When the voltage regulator 10 is first enabled, an initial binary value for the multi-bit bus signal (also referred to herein as the feedback control signal) can be derived from a programmed value input via the program interface controller over path 24. This programmed value may hence be set by a microcontroller or by software code executing on the system. This thus enables the initial value of Vout to be programmable. Whilst this initial programmable value allows some flexibility to choose suitable overdrive voltages for the power gating circuitry, it does not allow the output voltage from the voltage regulator to be tuned having regard to operating characteristics of the integrated circuit which vary during operation of the integrated circuit. Accordingly, as will be discussed in more detail below, a feedback mechanism allowing adaptive control of the overdrive voltage is provided with the aim of maintaining the leakage current within acceptable bounds whilst reducing wear out of the PMOS transistors 72, 74.

In particular, monitoring circuits 85, 90 output operating parameter data D1, D2 over paths 87, 92, respectively, these values being provided as input to the adaptive bias controller 20 over paths 32, 34, respectively. This operating parameter data is indicative of leakage current, and hence enables the adaptive bias controller 20 to vary the value of the feedback control signal provided over path 40 having regard to the actual observed leakage current. Any changes to the feedback control signal 40 bring about an associated change in the voltage output by the voltage regulator 10 over path 50, which in turn varies the amount by which the power gating transistors 72, 74 are driven into the super cut-off region, this in turn influencing the leakage current.

Various types of monitoring circuit may be provided. In the example shown in FIG. 1, a leakage sensor 85 is provided for monitoring the leakage current through the PMOS transistors 72, 74 of the power gating circuitry 70. Whilst the leakage sensor may directly measure leakage current, it may alternatively measure a property which correlates with leakage current, for example temperature. In particular, as the temperature of the integrated circuit rises, this will give rise to an increase in leakage current, and similarly as the temperature drops this will give rise to a decrease in leakage current. However the leakage sensor 85 is constructed, in one embodiment it is arranged to convert the analog signal that it monitors into a digital signal output over path 87.

There are a number of known circuits which could be used to perform this function, but in one embodiment the function is realised with a SAR (successive approximation) data converter. The resolution of the data converter depends on the accuracy desired, but typically a 6-bit SAR data converter circuit would provide a more than adequate level of resolution, in that it would allow up to 64 discrete digital levels to be indicated by the output D1. Typically, there will be a predetermined range of overdrive voltage that may be added by the voltage regulator to the supply voltage Vdd, the lower value in the range corresponding to a minimum overdrive voltage which is required in order to have any appreciable effect on leakage current, and the upper limit on overdrive voltage being determined by the properties of the PMOS transistors, and in particular an upper limit on voltage whereafter excessive wear out of the transistors is likely to occur. In one example embodiment, the range for the overdrive voltage is between 100 and 250 mV. The resolution required by the output of a SAR converter will be dependent on the number of discrete voltages within that range that the voltage regulator 10 is able to produce.

In addition to the leakage sensor 85, the integrated circuit of FIG. 1 also includes a process monitor 90 for monitoring the speed of operation of the logic circuitry 80 during its normal mode of operation, i.e. when it is powered up. The process monitor 90 is able to detect process skew, in particular determining whether the silicon is fast silicon (i.e. the integrated circuit is operating more quickly than the norm) or slow silicon (i.e. the integrated circuit is operating more slowly than the norm). This information has a correlation with leakage current, since components constructed on slow silicon have less leakage current than the same components constructed on fast silicon. As with the leakage sensor 85, the process monitor 90 will convert the values that it observes into a digital signal output over path 92. As with the leakage sensor 85, the process monitor 90 may suitably be constructed by a SAR data converter, for example a 6-bit SAR data converter.

Using the combination of the leakage sensor 85 and the process monitor 90, it will be seen that the adaptive bias controller 20 is provided with input signals that enable it to provide as a digital code a feedback control signal to the voltage regulator to adjust the optimal bias voltage to compensate for both leakage and process skew. The value of the voltage regulator output is then adjusted as a function of the process corner and temperature. For example, if the silicon material is "fast skew" and the temperature on the chip is hot, then the leakage current will be at a high level. In that case, the value of the overdrive voltage could be set for example to near the upper limit of 250 mV (assuming the earlier mentioned example range of 100 to 250 mV) by the voltage regulator 10 in response to a suitable value of feedback control signal input from the adaptive bias controller 20 over path 40. On the other hand, if the silicon material is "slow skew" and the chip temperature is cold, then the leakage current will be at a low level. In that case, the value of the overdrive voltage could be set to near the lower limit of 100 mV. By such an approach, the optimal gate bias point can be maintained in order to allow the power gate switches to be reverse biased (in the super cut off range) as much as necessary to reduce the leakage current to an acceptable level, but no more than necessary so as reduce wear out of the power gate switches.

As will be discussed in more detail later with reference to FIG. 2, the voltage regulator 10 will typically be coupled to an external capacitance 15 which serves to smooth out the operation of the voltage regulator when varying the output voltage Vout. As also shown in FIG. 1, the voltage regulator 10 will typically receive an input voltage Vddio which is higher than Vdd, thereby enabling the voltage regulator to generate a voltage Vout which is in excess of Vdd. In one particular example, the voltage Vddio may be 3.3 volts, whilst the voltage Vdd is 1.0 volts.

As also shown in FIG. 1, a clamping device 55 may be provided in association with the output path 50 to ensure that the voltage Vout cannot exceed Vdd by more than the maximum permitted overdrive voltage, hence providing a safety mechanism for ensuring that the PMOS transistors 72, 74 are not provided with a gate voltage exceeding a safe upper limit.

Figure 2:
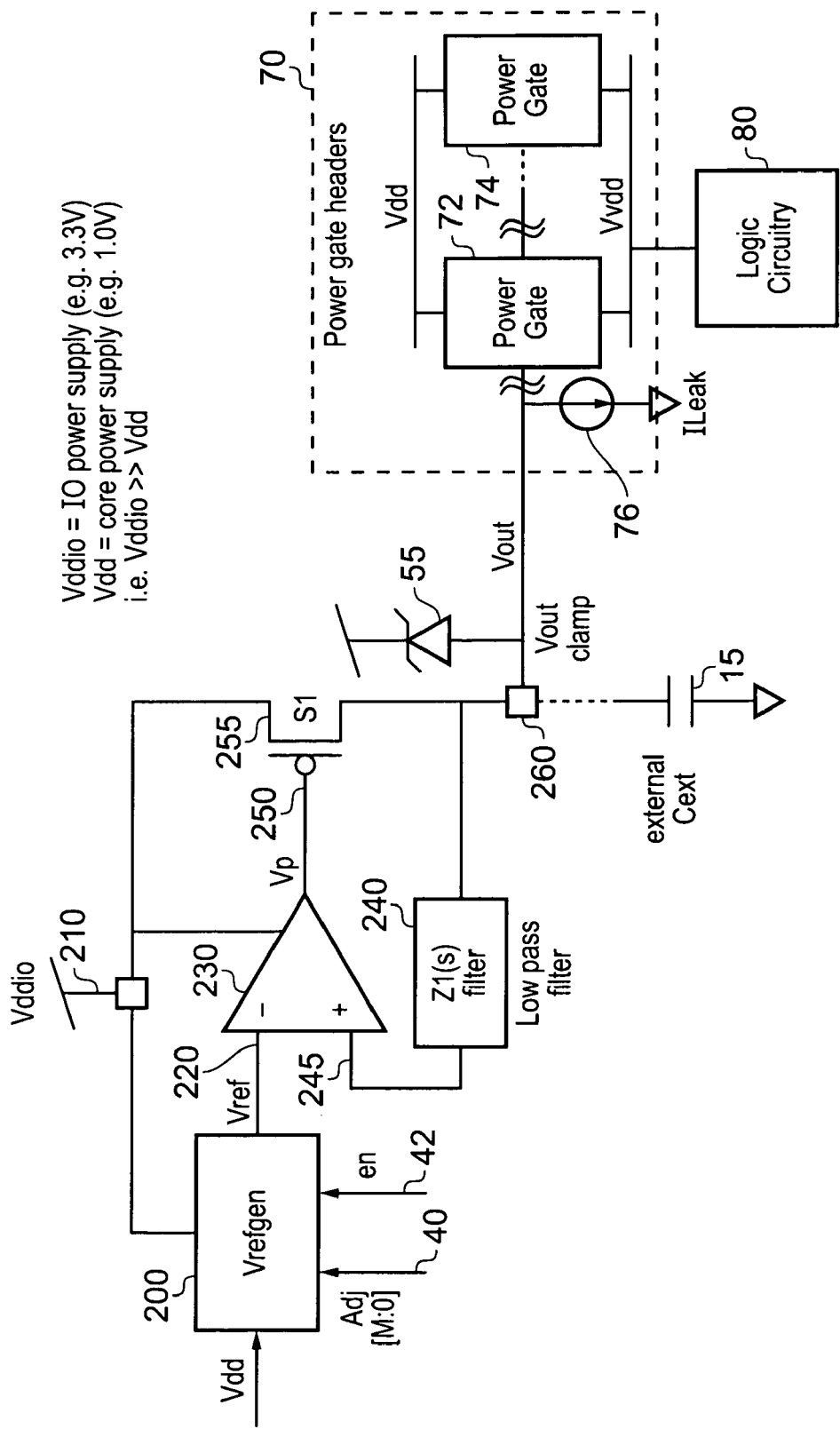
FIG. 2 is a diagram illustrating in more detail the operation of the voltage regulator shown in FIG. 1 in accordance with one embodiment.

FIG. 2 is a diagram illustrating in more detail the operation of the voltage regulator 10 in one embodiment. As shown in FIG. 2, a reference voltage generator 200 is provided which, when enabled over path 42, uses the supply voltage Vdd and the current value of the feedback control signal over path 40 to generate a reference voltage 220 representing the desired output voltage to be used to drive the gates of the PMOS transistors 72, 74 within the power gating circuitry 70. The reference voltage generator 200 is powered by the power supply Vddio to enable it to generate the required reference voltage.

Via the low pass filter block 240, the comparator 230 compares the output reference voltage 220 with the current voltage present at the node 260, the result of this comparison being used to generate the voltage 250 provided as an input to the gate of the PMOS transistor 255, so as to adjust the voltage at the node 260 until it corresponds to the reference voltage 220. The low pass filter 240, in combination with the external capacitance 15, serves to ensure stability in the operation of the voltage regulator 10 so that the voltage at the node 260 transitions smoothly to the required voltage, and is maintained at that required voltage. The voltage Vout present at the node 260 then provides a gate bias voltage to the power gates 72, 74 with the leakage current 76 then varying dependent on the value of that gate bias voltage.

It will be understood by those skilled in the art that the voltage regulator block can be operated in either a linear or a switch mode of operation. If the load to be driven by the output voltage is relatively low (for example 50 mA or less), then a linear mode of operation will typically be more appropriate, whilst if the load is relatively high (greater than 50 mA) then a switch mode of operation may be more appropriate.

Figure 3:
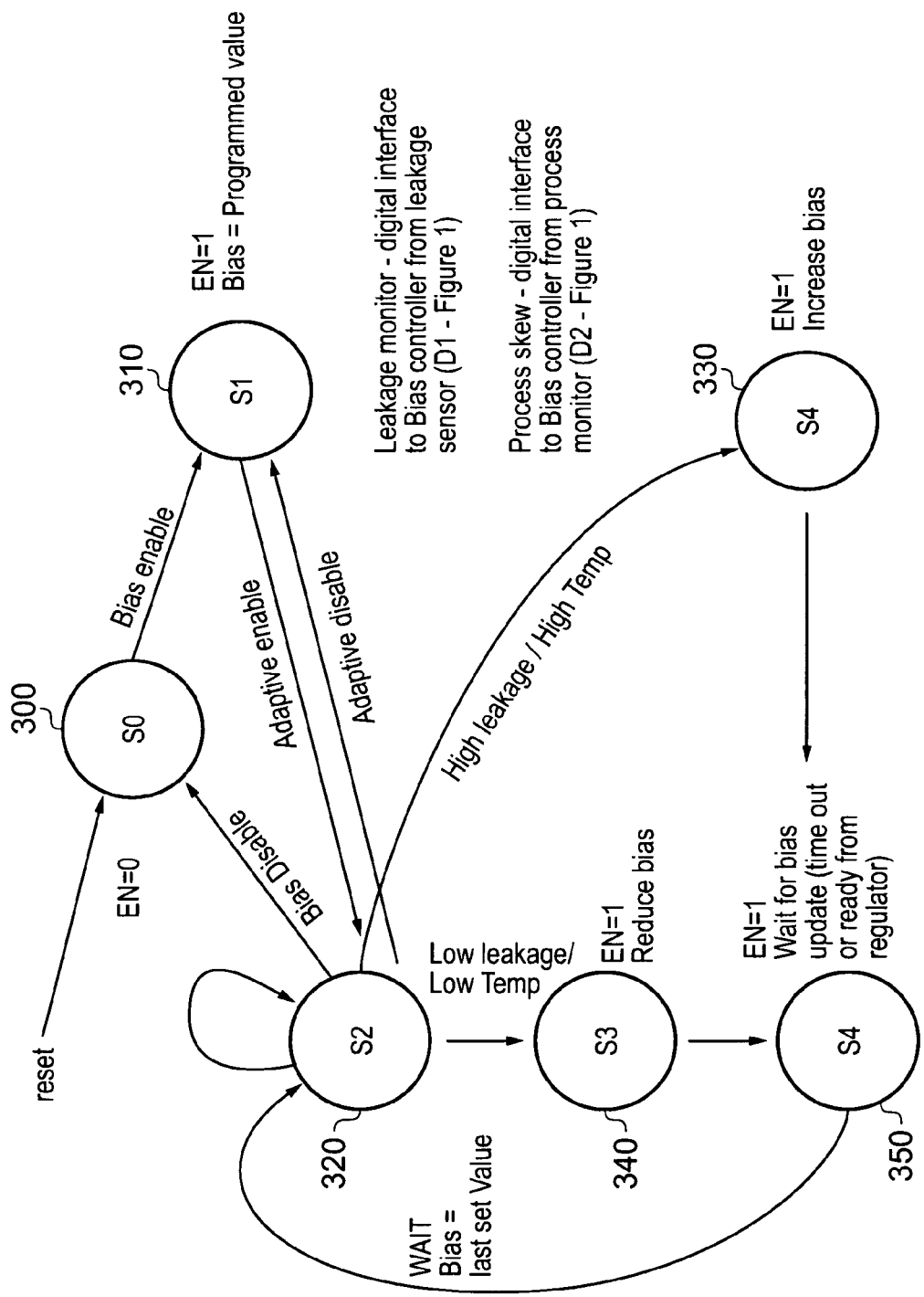
FIG. 3 is a finite state machine functional flow diagram illustrating the operation of the adaptive bias controller of FIG. 1 in accordance with one embodiment.

The adaptive bias controller 20 may be constructed in a variety of ways. However, in one embodiment, the adaptive bias controller is formed by a sequential finite state machine (FSM), which can be arranged to operate as shown in FIG. 3. On assertion of a reset signal, the adaptive bias controller enters the initial state 300, where the enable signal is deasserted, and the adaptive gate bias control operation is disabled. When a power saving mode of operation is to be entered, the enable signal can be set to cause the state to transition from the initial state 300 to the state 310. In this state, an initial programmed value for the feedback control signal is used to cause the voltage regulator to produce an output voltage Vout corresponding to that initial programmed value.

Thereafter, the state will transition to the adaptive bias state 320 where the adaptive bias controller 20 is responsive to the operating parameter data D1, D2 received over paths 32, 34. If that operating parameter data indicates a relatively high leakage current, i.e. a leakage current in excess of the desired leakage current, then the process transitions to state 330 where the feedback control signal is issued so as to increase the amount of overdrive voltage added to the supply voltage Vdd in order to produce the output voltage Vout from the voltage regulator 10. Similarly, if the operating parameter data indicates a level of leakage current below the desired level, then the state transitions from the state 320 to the state 340, where the adaptive bias controller 20 issues a feedback control signal so as to reduce the amount of overdrive voltage added to Vdd in order to produce the output voltage Vout from the voltage regulator 10.

Following either state 330 or state 340, the state machine transitions to state 350, where it awaits a bias update. In particular, during state 350, the adaptive bias controller awaits an indication that the control voltage most recently set by the voltage regulator circuitry has reached a steady state. This may be done for example by waiting for the elapse of a timer which begins counting when the modified feedback control signal is issued at either state 330 or state 340, or by awaiting a ready signal from the voltage regulator 10, which is only output to the adaptive bias controller 20 when the voltage regulator has produced a steady voltage at its output node 260. Once the steady state has been reached, the state transitions from state 350 back to state 320 where the operating parameter data D1, D2 is again monitored. This may cause the state machine to transition again to either state 330 or state 340, or if the operating parameter data indicates that the leakage current is currently within the desired leakage current range, then no action may be required, and the state machine may merely maintain the state 320 until the operating parameter data indicates that some change in the output voltage Vout is required (i.e. the leakage current is no longer within the desired leakage current range).

From the above description, it will be seen that the FSM embodying the adaptive bias controller 20 is able to take account of the fact that the leakage current in the system is ambient temperature, process and operating voltage dependent, and can accordingly reduce the voltage bias applied to the power gating transistors progressively to a lower threshold point when the overall leakage current is low. Conversely, as the leakage current increases, the FSM increases the gate bias voltage in order to reduce the leakage current, and can continue to do this until an upper threshold point is reached (e.g. Vdd+250 mV in the earlier mentioned example).

Figure 4:
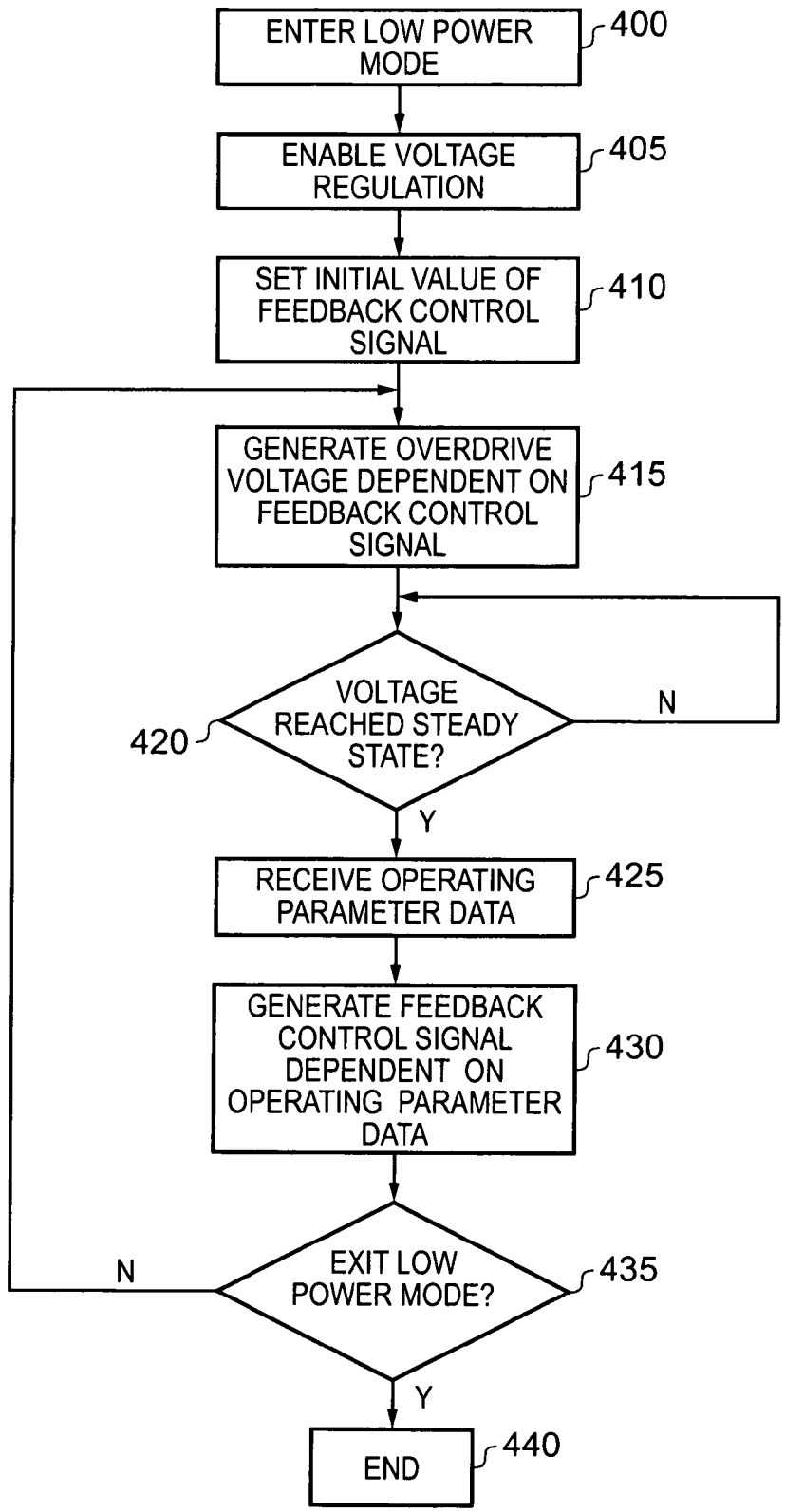
FIG. 4 is a flow diagram illustrating the operation of the circuitry of FIG. 1 in accordance with one embodiment.

FIG. 4 is a flow diagram illustrating the overall operation of the circuit of FIG. 1 when used to provide an overdrive voltage to the power gating circuitry. At step 400, it is determined that a low power mode of operation is required, and then the voltage regulation function is enabled at step 405, whereafter an initial value of the feedback control signal is set by the adaptive bias controller 20 at step 410. This causes the voltage regulator 10 to generate an overdrive voltage dependent on the feedback control signal at step 415, this overdrive voltage being between predetermined upper and lower limits as discussed earlier (for example between Vdd+100 mV and Vdd+250 mV).

Thereafter, it is determined at step 420 whether the voltage has reached a steady state, and when the steady state is reached the process proceeds to step 425, where the adaptive bias controller monitors the received operating parameter data. At step 430, the adaptive bias controller then generates a feedback control signal that is dependent on the operating parameter data. Provided it is determined at step 435 that the low power mode should not be exited, the process then loops back to step 415 where an overdrive voltage is generated dependent on the feedback control signal.

As discussed earlier with reference to FIG. 3, it will be understood that in situations where the operating parameter data received at step 425 indicates that the current gate bias voltage is producing the desired level of leakage current, then the feedback control signal issued at step 430 will result in the voltage regulator 10 maintaining its current overdrive voltage at step 415 and hence the voltage will already be at the steady state when assessed at step 420.

The process of FIG. 4 continues until the system is to return to the active mode of operation, at which point the process branches from step 435 to step 440 where the process ends. At this point the enable signal is de-asserted to disable operation of the voltage regulator 10, and cause the buffer circuitry 60 to provide a logic 0 input to the gates of the transistors 72, 74 within the power gating circuitry 70, causing those transistors to turn on and couple the logic circuitry 80 to the supply voltage Vdd.

Figure 5:
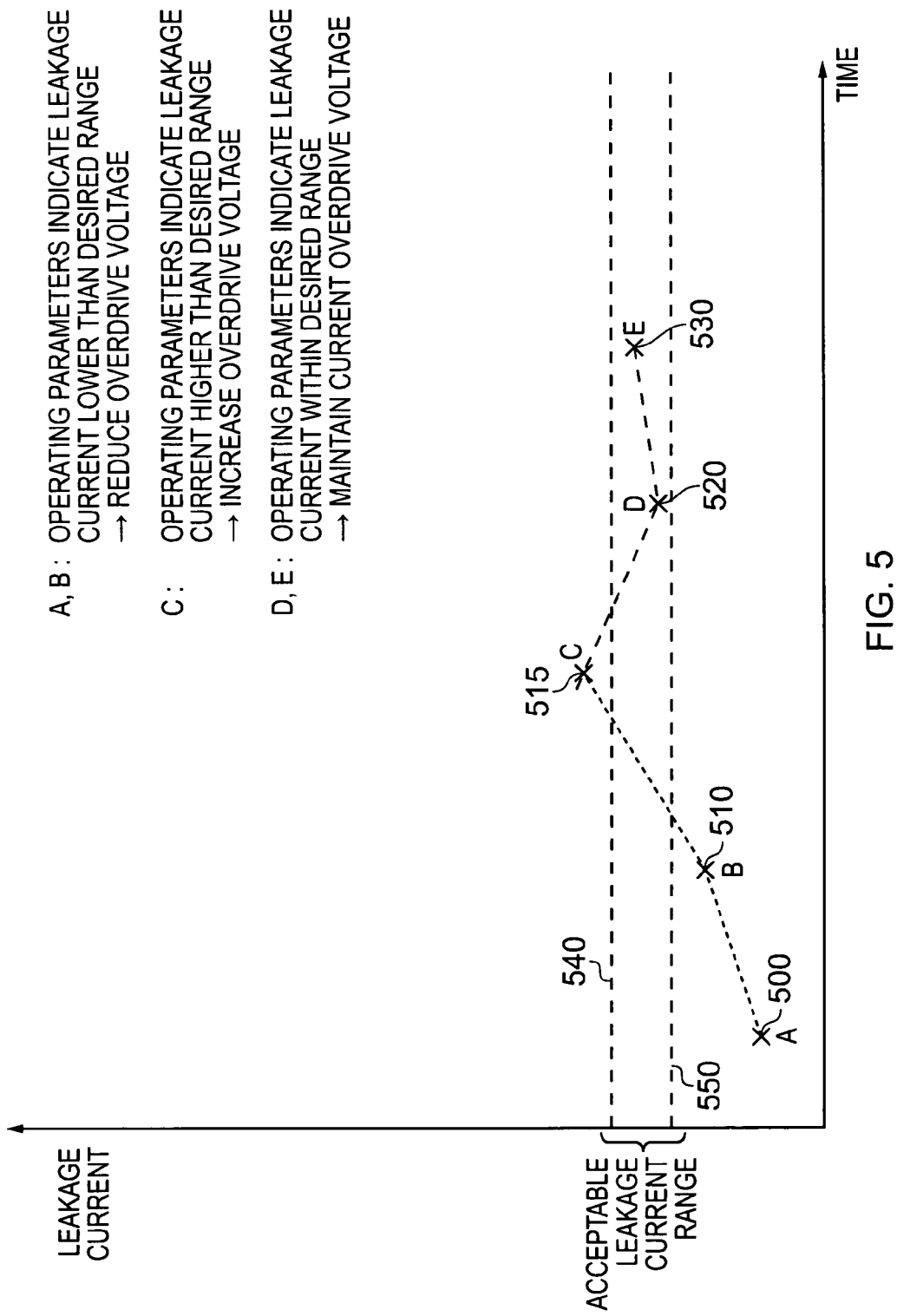
FIG. 5 is a graph schematically illustrating how the operation of the adaptive bias controller of embodiments serves to bring the leakage current to within an acceptable leakage current range.

FIG. 5 is a graph schematically illustrating how the adaptive bias controller 20 and voltage regulator 10 operate in one embodiment to modify the output voltage Vout so as to drive the leakage current to within an acceptable leakage current range, this acceptable leakage current range being bounded by the lines 540, 550 in FIG. 5. Accordingly, if the adaptive bias controller monitors the operating parameters at point A 500, it will assess that the operating parameters indicate that the leakage current is lower than the desired range, and accordingly the adaptive bias controller will issue a feedback control signal over path 40 to the voltage regulator 10, to cause the voltage regulator to decrease the overdrive voltage.

When a steady state is reached, and the adaptive bias controller 20 again analyses the operating parameter data at point B 510, it will see that whilst the leakage current has increased, it is still below the desired range, and hence will again issue a feedback control signal to the voltage regulator that causes the overdrive voltage to be reduced.

However, in the example shown in FIG. 5, it is assumed that the reduction turns out to be somewhat larger than was appropriate, and accordingly when the operating parameter data is again assessed at point C 515, it is determined that the leakage current is higher than the desired range. As a result, the adaptive bias controller issues a feedback control signal to cause the voltage regulator to increase the overdrive voltage.

When the steady state is then reached, and the operating parameter data is again analysed at point D 520, it is found that the operating parameter data indicates that the leakage current is within the desired range, and hence no change in the overdrive voltage is performed.

As illustrated by point E 530, the leakage current may naturally vary even whilst the overdrive voltage is being maintained at a steady level, due for example to changes in operating temperature of the circuit. However, whilst the leakage current remains within the acceptable range, no change in the overdrive voltage is made. In one embodiment, only when the operating parameters indicate that the leakage voltage has moved outside of the acceptable range bounded by the points 540, 550 will the adaptive bias controller again seek to modify the feedback control signal in order to alter the bias voltage.

Using the above described technique, the gate-bias control can be applied to power gated subsystems within the chip to support optimal low-power standby modes. One or more power gated regions can share a single voltage regulator, which may be provided within the chip or externally to the chip, enabling a reduction in system/board-level cost whilst supporting fast and efficient power gating (PG), and optional state-retention power-gating (SRPG). The leakage power for the PG switched subsystem is dependent on the silicon process and exponentially scaled with die temperature as a result of the on-chip transistor power gates being imperfect switches.

Although example embodiments have been described herein, it will be appreciated that the claims are not limited thereto and that many modifications and additions thereto may be made within the scope of the claims.

We claim:

1. An integrated circuit comprising:
   a block of components;
   power gating circuitry configured to receive a source voltage supply, and to provide an internal voltage supply to said block of components, in a first mode of operation the internal voltage supply being derived from the source voltage supply, and in a power saving mode of operation the power gating circuitry being configured to isolate the internal voltage supply from the source voltage supply;
   voltage regulator circuitry configured to provide a control voltage to said power gating circuitry during said power saving mode of operation, the control voltage being settable to any of a plurality of predetermined voltage levels;
   an adaptive controller configured to receive operating parameter data from at least one of the block components and the power gating circuitry, the operating parameter data being indicative of leakage current within the power gating circuitry, and the adaptive controller being configured to issue a feedback control signal to the voltage regulator circuitry whose value is dependent on the received operating parameter data;
   the voltage regulator circuitry being responsive to the feedback control signal to change the control voltage between said plurality of predetermined voltage levels until the operating parameter data indicates a desired leakage current has been obtained within the power gating circuitry, wherein:
   the power gating circuitry comprises at least one PMOS transistor whose gate is driven by the control voltage during said power saving mode of operation;
   the control voltage is set to exceed the source voltage supply by an overdrive voltage, the overdrive voltage being variable so as to enable any of said plurality of predetermined voltage levels to be set as said control voltage;
   when the operating parameter data indicates that the leakage current is exceeding the desired leakage current, the adaptive controller is configured to set the feedback control signal to a value that causes the voltage regulator circuitry to increase the overdrive voltage provided a maximum predetermined voltage level has not been reached; and
   when the operating parameter data indicates that the leakage current is below the desired leakage current, the adaptive controller is configured to set the feedback control signal to a value that causes the voltage regulator circuitry to decrease the overdrive voltage provided a minimum predetermined voltage level has not been reached.

2. An integrated circuit as claimed in claim 1, wherein when the operating parameter data indicates that the leakage current matches the desired leakage current, the adaptive controller is configured to set the feedback control signal to a value that causes the voltage regulator circuitry to maintain a currently set overdrive voltage.

3. An integrated circuit as claimed in claim 1, wherein the desired leakage current is specified as a range of leakage current values.

4. An integrated circuit as claimed in claim 1, wherein the adaptive controller comprises a state machine that is configured to be enabled when said low power mode is entered, the state machine being configured to transition between a plurality of states dependent on the received operating parameter data.

5. An integrated circuit as claimed in claim 4, wherein following a feedback adjustment state where the value of the feedback control signal is changed, the state machine is configured to enter a waiting state where a predetermined event is awaited before the state machine transitions to a monitoring state to monitor the received operating parameter data.

6. An integrated circuit as claimed in claim 5, wherein the predetermined event is indicative that the control voltage most recently set by the voltage regulator circuitry has reached a steady state.

7. An integrated circuit as claimed in claim 1, wherein the feedback control signal is an M bit value, enabling up to $2^m$ discrete predetermined voltage levels for the control voltage to be specified.

8. An integrated circuit as claimed in claim 1, wherein the adaptive controller has an interface via which an initial value of said feedback control signal is specified.

9. An integrated circuit as claimed in claim 1, further comprising:
one or more monitoring circuits for monitoring said at least one of the block of components and the power gating circuitry in order to produce said operating parameter data.

10. An integrated circuit as claimed in claim 9, wherein:
said one or more monitoring circuits comprise a leakage sensor for detecting said leakage current in said at least one of the block of components and the power gating circuitry whilst in said low power mode of operation.

11. An integrated circuit as claimed in claim 9, wherein:
said one or more monitoring circuits comprise a temperature sensor for monitoring the operating temperature of said at least one of the block of components and the power gating circuitry.

12. An integrated circuit as claimed in claim 9, wherein:
said one or more monitoring circuits comprise process skew monitoring circuitry for monitoring speed of operation of the block of components during the first mode of operation.

13. A method of controlling power gating in an integrated circuit having a block of components, and power gating circuitry for receiving a source voltage supply and for providing an internal voltage supply to said block of components, in a first mode of operation the internal voltage supply being derived from the source voltage supply, and in a power saving mode of operation the power gating circuitry being configured to isolate the internal voltage supply from the source voltage supply, the method comprising the steps of:
employing a voltage regulator to provide a control voltage to said power gating circuitry during said power saving mode of operation, the control voltage being settable to any of a plurality of predetermined voltage levels;
obtaining operating parameter data from at least one of the block of components and the power gating circuitry, the operating parameter data being indicative of leakage current within the power gating circuitry;
issuing a feedback control signal to the voltage regulator whose value is dependent on the received operating parameter data;
responsive to the feedback control signal, changing at the voltage regulator the control voltage between said plurality of predetermined voltage levels until the operating parameter data indicates a desired leakage current has been obtained within the power gating circuitry wherein:
the power gating circuitry comprises at least one PMOS transistor whose gate is driven by the control voltage during said power saving mode of operation, and the method further comprises:
setting the control voltage to exceed source voltage simply by an overdrive voltage, the overdrive voltage being variable so as to enable any of said plurality of predetermined voltage levels to be set as said control voltage;
when the operating parameter data indicates that the leakage current is exceeding the desired leakage current, setting the feedback control signal to a value that causes the voltage regulator to increase the overdrive voltage provided a maximum predetermined voltage level has not been reached; and
when the operating parameter data indicates that the leakage current is below the desired leakage current, setting the feedback control signal to a value that causes the voltage regulator to decrease the overdrive voltage provided a minimum predetermined voltage level has not been reached.

14. An integrated circuit comprising:
a block of component means;
power gating means for receiving a source voltage supply, and for providing an internal voltage supply to said block of component means, in a first, mode of operation the internal voltage supply being derived from the source voltage supply, and in a power saving mode of operation the power gating means for isolating the internal voltage supply from the source voltage supply;
voltage regulator means for providing a control voltage to said power gating means during said power saving mode of operation, the control voltage being settable to any of a plurality of predetermined voltage levels;
adaptive controller means for receiving operating parameter data from at least one of the block of component means and the power gating means, the operating parameter data being indicative of leakage current within the power gating means, and the adaptive controller means for issuing a feedback control signal to the voltage regulator means whose value is dependent on the received operating parameter data;
the voltage regulator means, responsive to the feedback control signal, for changing the control voltage between said plurality of predetermined voltage levels until the operating parameter data indicates a desired leakage current has been obtained within the power gating means wherein:
the power gating means comprises at least one PMOS transistor whose gate is driven by the control voltage during said power saving mode of operation;
the control voltage is set to exceed the source voltage supply by an overdrive voltage, the overdrive voltage being variable so as to enable any of said plurality of predetermined voltage levels to be set as said control voltage;
when the operating parameter data indicates that the leakage current is exceeding the desired leakage current, the adaptive controller means is configured to set the feedback control signal to a value that causes the voltage regulator means to increase the overdrive voltage provided a maximum predetermined voltage level has not been reached; and
when the operating parameter data indicates that the leakage current is below the desired leakage current, the adaptive controller is configure to set the feedback control signal to a value that causes the voltage regulator means to decrease the overdrive voltage provided a minimum predetermined voltage level has not been reached.

* * * * *